SOLAR CELL DELAY WITH TRANSISTOR FEEDBACKS

Filed May 17, 1966 2 Sheets-Sheet 1

INVENTOR.
RICHARD L. WHITE
BY John J. McLaughlin
ATTORNEY

Jan. 6, 1970 R. L. WHITE 3,488,506

SOLAR CELL DELAY WITH TRANSISTOR FEEDBACKS

Filed May 17, 1966 2 Sheets-Sheet 2

INVENTOR.
RICHARD L. WHITE
BY John J. McLaughlin
ATTORNEY

United States Patent Office 3,488,506

Patented Jan. 6, 1970

3,488,506

SOLAR CELL DELAY WITH TRANSISTOR FEEDBACKS

Richard L. White, Phoenix, Ariz., assignor to Dickson Electronics Corporation, a corporation of Arizona Filed May 17, 1966, Ser. No. 550,827

Int. Cl. H01j 39/12

U.S. Cl. 250—212 12 Claims

ABSTRACT OF THE DISCLOSURE

A radiation sensitive relay utilizing a solar cell having one side thereof connected to a voltage divider and being incorporated in a feedback loop including a pair of transistors collector-to-base connected.

This invention pertains to radiation sensitive relays, and, more particularly, to relays commonly referred to as optical relays.

The utilization of light or optical relays has become widespread throughout the electronics industry; however, difficulties have arisen through the utilization of solar cells as triggering media for switching solid state relays. Radiation sensitive devices such as solar cells exhibit stability problems when the ambient temperature exceeds very limited ranges. At high temperature, solar cells exhibit a current leakage resulting in undesirable effects on the circuits to which they are connected.

Optical relays utilizing solar cells having high temperature stability problems are thus hampered in that the sensitivity of the relay must be reduced to accommodate the instability of the solar cell. Therefore, prior art radiation sensitive relays have compromised between the desirable attributes of high sensitivity and high temperature stability.

It is therefore an object of the present invention to provide a radiation sensitive relay capable of providing high temperature stability without sacrificing relay sensitivity.

It is another object of the present invention to provide a radiation sensitive relay that may be readily adjusted to provide high temperature stability in a simple and convenient manner.

It is still another object of the present invention to provide a radiation sensitive relay capable of attaining sensitivity of a degree heretofore unobtainable without sacrificing high temperature stability, and, thus, the ability of the relay to operate at high temperatures.

Briefly, in accordance with one embodiment of the present invention, a radiation sensitive relay circuit is provided utilizing complementary transistors connected in a feedback arrangement. The feedback loop is provided with a voltage divider network to which a solar cell is connected. Radiation impinging on the solar cell results in the generation of a solar cell voltage triggering the feedback loop and switching the relay to its conducting state. A considerably improved embodiment is also described wherein the sensitivity of the relay is greatly increased without sacrificing high temperature stability by introducing the emitter-collector circuit of the third transistor in the feedback between the complementary transistors.

The present invention may more readily be described by reference to the accompanying drawings in which.

Figure 1:
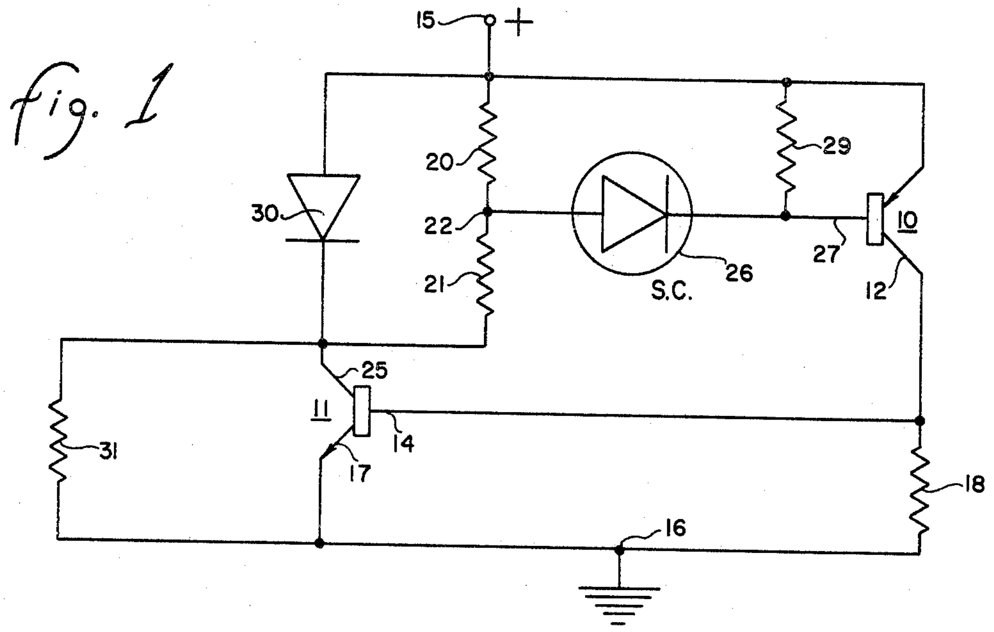
FIG. 1 is a schematic circuit diagram of a radiation sensitive relay constructed in accordance with the teachings of the present invention.

Referring to FIG. 1, a pair of complementary transistors 10 and 11 are connected in a feedback arrangement with the collector electrode 12 of the transistor 10 connected to the base electrode 14 of the transistor 11. A biasing source is provided and in the embodiment chosen for illustration, it is shown simply as a terminal 15 that may be connected to a source of positive potential and a terminal 16 which may be connected to ground. The terminal 16 is connected to emitter electrodes 17 of the transistor 11 and to the collector electrode 12 of the transistor 10 through a resistor 18.

A voltage dividing network is provided and comprises resistors 20 and 21 connected at a common junction 22. The network is connected between the terminal 15 and the collector electrode 25 of the transistor 11. A solar cell 26 is connected between the common junction 22 and the base electrode 27 of the transistor 10. A resistor 29 is shown connected between the terminal 15 and the base electrode 27. A unidirectional conducting device such as a diode 30 may be connected having its anode connected to the terminal 15 and its cathode connected to the collector 25 of the transistor 11. A biasing resistor 31 is connected across and in parallel with the emitter-collector circuit of the transistor 11.

Figure 2:
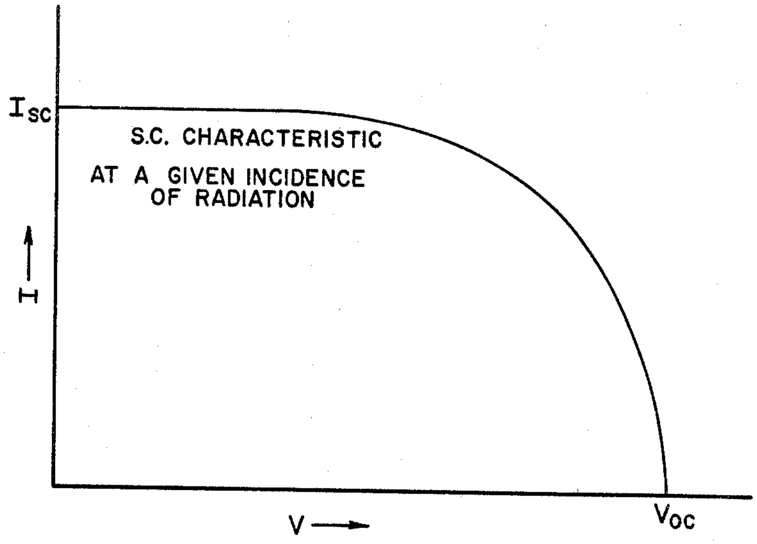
FIG. 2 is an idealized solar cell voltage-current characteristic.

Referring to FIG. 2, an idealized characteristic of the solar cell 26 of FIG. 1 is shown. The characteristic is shown and indicates a current of $I_{sc}$ representing the short circuit current of the solar cell, a voltage of $V_{oc}$ indicating the open circuit voltage of the solar cell, and the current-voltage relation between short and open circuits. It will be apparent that considerable voltage regulation occurs at the output of the solar cell, and a very limited current drain may be imposed upon the solar cell without seriously impairing its efficacy as a triggering element for the solid state circuit.

The operation of FIG. 1 may now be described. In the quiescent state no current flows from terminal 15 through terminal 16 except the biasing current flowing through the parallel paths of the diode 30 and the resistors 20 and 21 and then through the biasing resistor 31. This current may be adjusted to a relatively insignificant value for most applications in which an optical relay or radiation sensitive relay may be used. The quiescent state current flowing through the voltage divider network comprising resistors 20 and 21 results in a voltage drop across the resistor 20. When light or radiation impinges on the solar cell 26, this incidence of radiation results in the generation of a voltage as indicated in FIG. 2 which adds to the voltage existing across the resistor 20. The combined voltages result in the forward biasing of the transistor 10. As transistor 10 begins conduction, the feedback loop through the transistor 11 results in a regenerative action to switch the relay to its conducting state. The circuit of FIG. 1 may be adjusted to provide high temperature stability by shorting across the solar cell 26 and subsequently raising the temperature of the circuit to the desired high temperature operating range. Resistor 20 may then be adjusted so that the relay of FIG. 1 will not switch to the conducting state. The solar cell 26 may then be replaced and the circuit is ready for operation and will exhibit high temperature stability.

Figure 3:
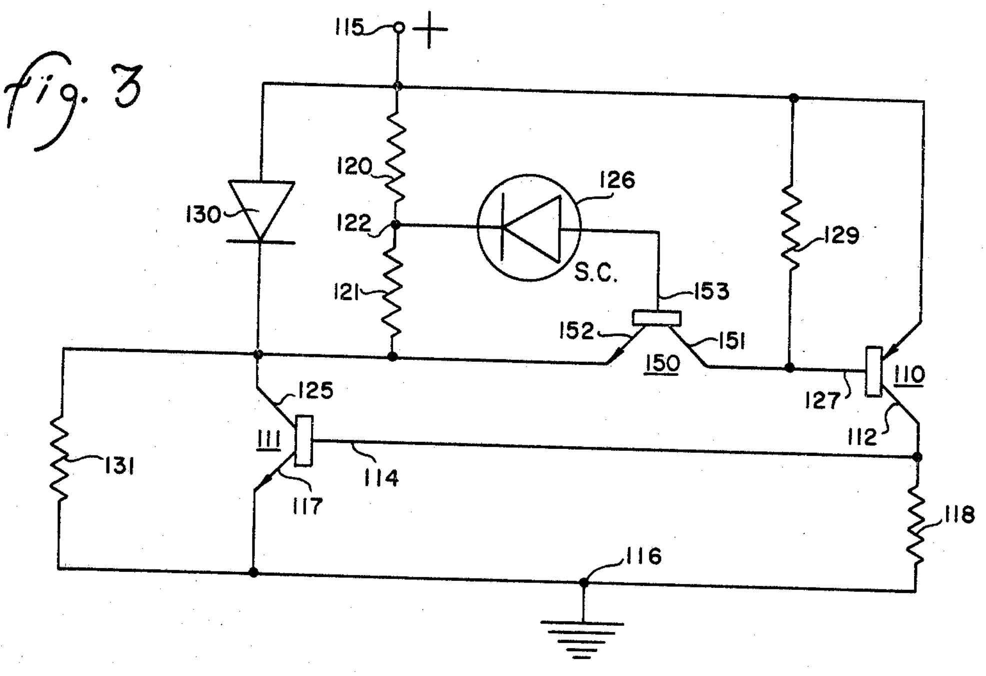
FIG. 3 is a circuit diagram of another embodiment of the present invention.

While the high temperature stability provided by the circuit of FIG. 1 represents a considerable advance over the prior art, still another advance is represented by the circuit of FIG. 3 wherein the high temperature stability of FIG. 1 is preserved and considerable sensitivity is provided thereby resulting in a radiation sensitive relay having high temperature stability and increased sensitivity. Referring to FIG. 3, many of the elements are identical to those shown in FIG. 1 and therefore are numbered alike with the exception of an added numeral "1" in front thereof. Thus, diode 30 of FIG. 1 becomes diode 130 of FIG. 3. The significant difference between FIG. 3 and FIG. 1 immediately becomes apparent, and it is seen that a third transistor 150 has been inserted in the feedback path between transistors 110 and 111, and is connected thereto by having the electro-electrode 151 connected to the base electrode 127 of transistor 110 and by having the emitter electrode 152 connected to the collector electrode 125 of the transistor 111. The solar cell 126 is now connected in a polarity reversed to that of FIG. 1 to facilitate the "gating" of the N-P-N transistor 150 instead of the P-N-P transistor 10 of FIG. 1. The solar cell 126 is connected to the base electrode 153 of the transistor 150 and is also connected to the common junction 122 between the resistor 120 and resistor 121. The operation of the circuit of FIG. 3 is similar to that of FIG. 1 with the exception that the voltage drop across resistor 121 is used in combination the voltage generated by the solar cell 126 to gate the transistor 150 to the conducting state. Since we are now utilizing the gain of three transistors in a feedback loop and are gating an N-P-N transistor by the solar cell, substantial increase sensitivity may be obtained over the circuit of FIG. 1 without sacrificing the high temperature stability afforded by the circuit of FIG. 1. The adjusting of FIG. 3 to obtain high temperature stability is identical to that of FIG. 1 in that the solar cell 126 is short circuited and the temperature of the circuit is raised. Resistor 120 is adjusted so that the circuit will not gate to the conducting state and the solar cell is then replaced. The regenerative action of the feedback connections provide an unusually reliable snap action that is not hindered by ambient temperature variations; the sensitivity provided by the third transistor in the feedback circuit as shown in FIG. 3 attains a level of sensitivity incapable by prior art designs without the sacrifice of high temperature stability.

The resistors 18 and 29 of FIG. 1 and the resistors 118 and 129 of FIG. 3 are used for temperature compensation to counteract the effect of temperature on the remaining solid state devices of the circuit. It will be obvious to those skilled in the art that many modifications and substitutions of elements may be made in the circuits of the present invention without departing from the spirit and scope thereof. It is therefore intended that the present invention be limited only by the scope of the claims appended hereto.

I claim:

1. A radiation sensitive relay comprising:
(a) a first circuit element having an input electrode and output electrode and a control electrode;
(b) a second circuit element having an input electrode and output electrode and a control electrode;
(c) means connecting the output electrode of said first circuit element to the control electrode of said second circuit element;
(d) a bias source having a first and second terminal;
(e) a voltage divider network connected between said first terminal and the input electrode of said second circuit element, said voltage divider network comprising a pair of resistors connected at a common junction;
(f) a radiation responsive device connected between said common junction and the control electrode of said first circuit element for generating an electrical response to the impedance of radiation thereupon and for controlling the electrical state of said first circuit element;
(g) means connecting said first terminal to the input electrode of said first circuit element and connecting the second terminal to the output electrodes of said first and second circuit elements.

2. The apparatus as defined in claim 1 wherein said radiation responsive device is a solar cell.

3. The apparatus as defined in claim 1 wherein said first and second circuit elements are transistors.

4. A radiation sensitive relay comprising:
(a) a P-N-P transistor having an emitter electrode, a collector electrode, and a base electrode;
(b) an N-P-N transistor having an emitter electrode, a collector electrode, and a base electrode;
(c) means connecting the electro-electrode of said P-N-P transistor to the base electrode of said N-P-N transistor;
(d) a bias source having a first and a second terminal;
(e) a voltage divider network connected between said first terminal and the collector electrode of said N-P-N transistor, said voltage divider network comprising a pair of resistors connected at a common junction;
(f) a solar cell connected between said common junction and the base electrode of said P-N-P transistor for generating an electrical response to the impedance of radiation thereupon and for controlling the electrical state of said P-N-P transistor;
(g) means connecting said first terminal to the emitter electrode of said P-N-P transistor and connecting said second terminal to the emitter electrode of said N-P-N transistor and to the collector electrode of said P-N-P transistor.

5. Apparatus defined in claim 1, including a unidirectional conducting device having
(a) a first and a second electrode;
(b) means connecting the first electrode of said unidirectional conducting device to said first terminal and the second electrode of said unidirectional conducting device to the input electrode of said second circuit element; and
(c) a biasing resistor connected between the input and output electrodes of said second circuit element.

6. A radiation sensitive relay comprising:
(a) a first circuit element having an input electrode, an output electrode and a control electrode;
(b) a second circuit element having an input electrode, an output electrode and a control electrode;
(c) a third circuit element having an input electrode, an output electrode and a control electrode;
(d) means connecting the output electrode of said first circuit element to the control electrode of said second circuit element;
(e) means connecting the input electrode of said third circuit element to the control electrode of said first circuit element, and the output of said third circuit element to the input of said second circuit element;
(f) a bias source having a first and a second terminal;
(g) a voltage divider network connected between said first terminal and said input electrode of said second circuit element, said voltage divider network comprising a pair of resistors connected at a common junction;
(h) a radiation responsive device connected between said common junction and the control electrode of said third circuit element for generating an electrical response to the impedance of radiation thereupon and for controlling the electrical state of said third circuit element;
(i) means connecting said first terminal to the input electrode of said first circuit element and connecting said second terminal to the output electrodes of said first and second circuit elements.

7. The apparatus defined in claim 6, wherein said radiation responsive device is a solar cell.

8. The apparatus defined in claim 6, wherein said first, second and third circuit elements are transistors.

9. A radiation sensitive relay comprising:
(a) a first transistor of the P-N-P type having an emitter electrode, a collector electrode, and a base electrode;

(b) a second and a third transistor of the N-P-N type each having an emitter electrode, a collector electrode, and a base electrode;

(c) means connecting the collector electrode of said first transistor to the base electrode of said second transistor;

(d) means connecting the emitter electrode of said third transistor to the base electrode of said first transistor, and the emitter electrode of said third transistor to the collector electrode of said second transistor;

(e) a bias source having a first and a second terminal;

(f) a voltage divider network connected between said first terminal and the collector electrode of said second transistor, said voltage divider network comprising a pair of resistors connected at a common junction;

(g) a solar cell connected between said common junction and the base electrode of said third transistor for generating an electrical response to the impedance of radiation thereupon and for controlling the electrical state of said third transistor;

(h) means connecting said first terminal to the emitter electrode of said first transistor and connecting said second terminal to the emitter electrode of said second transistor and the collector electrode of said first transistor.

10. The apparatus defined in claim 6, including (a) a unidirectional conducting device having a first and a second electrode;

(b) means connecting the first electrode of said unidirectional conducting device to said first terminal and the second electrode of said unidirectional conducting device to the input electrode of said circuit element; and (c) a biasing resistor connected between the input and output electrodes of said second circuit element.

11. The apparatus defined in claim 9, including (a) a unidirectional conducting device having a first and a second electrode;

(b) means connecting the first electrode of said unidirectional conducting device to said first terminal and the second electrode of said unidirectional conducting device to the collector electrode of said second transistor; and (c) a biasing resistor connected between the collector and emitter electrodes of said second transistor.

12. The apparatus defined in claim 4, including (a) a unidirectional conducting device having a first and a second electrode;

(b) means connecting the first electrode of said unidirectional conducting device to said first terminal and the second electrode of said unidirectional conducting device to the electro-electrode of said N-P-N transistor; and (c) a biasing resistor connected between the collector and emitter electrodes of the said N-P-N transistor.

References Cited

UNITED STATES PATENTS

| | | | |
|---|---|---|---|
| 2,892,165 | 6/1959 | Lindsay | 307—88.5 |
| 3,303,380 | 2/1967 | Kozikowski | 330—25 |
| 3,313,939 | 4/1967 | Spencer | 250—212 |

RALPH G. NILSON, Primary Examiner

MARTIN ABRAMS, Assistant Examiner

U.S. Cl. X.R.

250—206, 214; 307—311

UNITED STATES PATENT OFFICE
CERTIFICATE OF CORRECTION

Patent No. 3,488,506 January 6, 1970

Richard L. White

It is certified that error appears in the above identified patent and that said Letters Patent are hereby corrected as shown below:

In the heading to the drawings sheets 1 and 2, and in the heading to the printed specification, line 2, "DELAY", each occurrence, should read -- RELAY --.

Signed and sealed this 23rd day of February 1971.

(SEAL)
Attest:

Edward M. Fletcher, Jr.
Attesting Officer

WILLIAM E. SCHUYLER, JR.
Commissioner of Patents